United States Patent
Shioya et al.

(10) Patent No.: US 6,479,409 B2
(45) Date of Patent: Nov. 12, 2002

(54) FABRICATION OF A SEMICONDUCTOR DEVICE WITH AN INTERLAYER INSULATING FILM FORMED FROM A PLASMA DEVOID OF AN OXIDIZING AGENT

(75) Inventors: Yoshimi Shioya, Tokyo (JP); Kouichi Ohira, Tokyo (JP); Kazuo Maeda, Tokyo (JP); Tomomi Suzuki, Tokyo (JP); Hiroshi Ikakura, Tokyo (JP); Youichi Yamamoto, Tokyo (JP); Yuichiro Kotake, Tokyo (JP); Shoji Ohgawara, Tokyo (JP); Makoto Kurotobi, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/790,568

(22) Filed: Feb. 23, 2001

(65) Prior Publication Data

US 2001/0031563 A1 Oct. 18, 2001

(30) Foreign Application Priority Data

| Feb. 28, 2000 | (JP) | 2000-051641 |
| Mar. 7, 2000 | (JP) | 2000-062393 |
| Aug. 31, 2000 | (JP) | 2000-264225 |

(51) Int. Cl.$^7$ .................. H01L 21/31; H01L 21/469
(52) U.S. Cl. .................. 438/790; 438/787; 438/788
(58) Field of Search .................. 438/787, 788, 438/789, 790

(56) References Cited

U.S. PATENT DOCUMENTS

| 5,314,724 A | * | 5/1994 | Tsukune et al. ............ 427/489 |
| 5,494,859 A | | 2/1996 | Kapoor ........................ 437/235 |
| 5,605,867 A | | 2/1997 | Sato et al. ................... 437/235 |
| 5,656,337 A | | 8/1997 | Park et al. ................... 427/539 |
| 5,985,091 A | * | 11/1999 | Suzuki ........................ 156/345 |
| 6,068,884 A | * | 5/2000 | Rose et al. ............... 427/255.6 |
| 6,093,637 A | | 7/2000 | Kishimoto et al. ......... 438/624 |
| 6,228,751 B1 | * | 5/2001 | Yamazaki et al. .......... 438/585 |

FOREIGN PATENT DOCUMENTS

| DE | 19654737 A1 | 12/1995 |
| EP | 0 759 481 A1 | 6/1996 |
| EP | 0 935 283 A2 | 2/1999 |
| EP | 0 960 958 A2 | 5/1999 |
| EP | 1 054 444 A1 | 5/1999 |
| JP | 9-186146 | 7/1997 |
| JP | 9-275103 | 10/1997 |
| JP | 11-288931 | 10/1999 |
| WO | 99/41423 | 2/1999 |

* cited by examiner

Primary Examiner—Michael S. Lebentritt
Assistant Examiner—Brad Smith
(74) Attorney, Agent, or Firm—Lorusso & Loud

(57) ABSTRACT

Disclosed is a method of fabricating a semiconductor device, in which an interlayer insulating film having a low dielectric constant is formed by coating a wiring, and either a via hole or a contact hole is formed in the interlayer insulating film. The method of fabricating a semiconductor device having the interlayer insulating film 25 formed on the film-formed substrate 21 with the exposed wiring 23, comprises the step of converting a silicon compound containing only the Si, O, C and H into a plasma gas as a film-forming gas to react the plasma gas, thus forming the block insulating film 24 containing silicon (Si), oxygen (O), carbon (C) and hydrogen (H) between the wiring 23 and the interlayer insulating film 25.

20 Claims, 13 Drawing Sheets

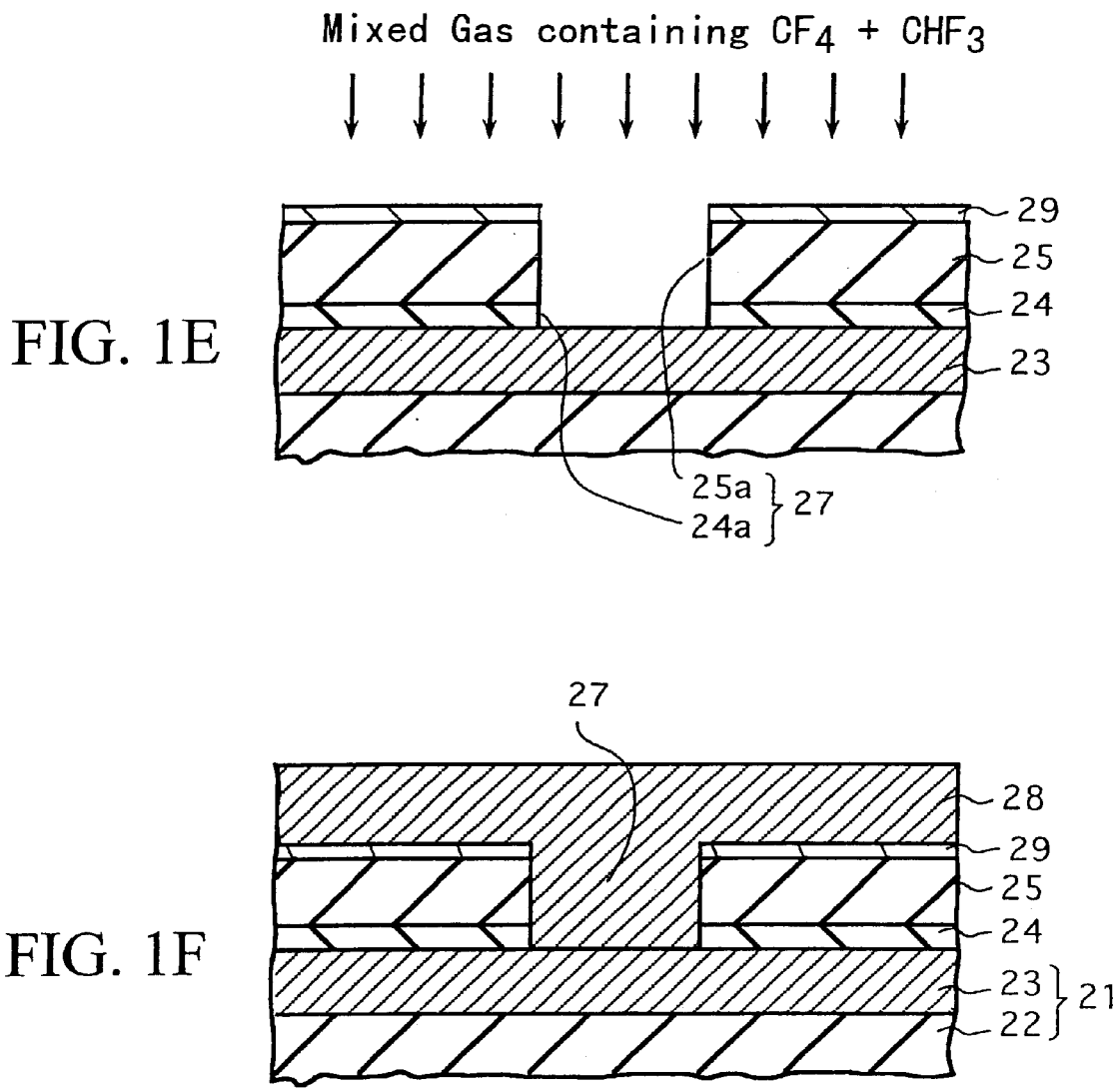

FABRICATION OF A SEMICONDUCTOR DEVICE WITH AN INTERLAYER INSULATING FILM FORMED FROM A PLASMA DEVOID OF AN OXIDIZING AGENT

BACKGROUND OF THE INVENTION

1. Field of the Invention

The present invention relates to a semiconductor device and a method of fabricating the same, in which an interlayer insulating film having a low dielectric constant is formed so as to coat a wiring and either a via hole or a contact hole is formed in the interlayer insulating film.

2. Description of the Prior Art

Recent years, as a semiconductor integrated circuit device has come to be more highly integrated and denser, accelerating of a data transfer speed has been demanded. For this reason, a low dielectric constant film offering little RC delay is used. Examples are a SiOF film having a relative dielectric constant of 3.5 to 3.8 and a porous $SiO_2$ film having a relative dielectric constant of 3.0 to 3.1.

On the other hand, wiring materials are changing from the conventional aluminum (Al) to copper (Cu) with low electric resistance.

An insulating film having a low dielectric constant (hereinafter referred to as low dielectric constant film) is formed on a copper wiring, and after this a via hole is formed in the low dielectric constant film. At this time, a block film for protecting the copper wiring is required in order to prevent the copper wiring from being oxidized and etched. Conventionally, a silicon nitride film (hereinafter referred to as SiN film) has been used as the block film.

However, there exists a problem that a relative dielectric constant of the SiN film is as high as about 7.

Alternatively, as the block insulating film, use of a SiC film formed by a plasma enhanced CVD method has been conceived. Although a relative dielectric constant of the SiC film is about 5 which is relatively low, the SiC film is accompanied with a problem of a relatively large leakage current which results in generation of leakage current between wirings that sandwiches a interlayer insulating film.

It is also preferable for the block insulating film to have a function of preventing the diffusion of ingredients contained in the wiring (e.g. copper) to an interlayer insulating film.

SUMMARY OF THE INVENTION

The object of the present invention is to provide a semiconductor device capable of preventing oxidation and etching of a wiring, when an interlayer insulating film having a low dielectric constant is formed so as to coat the wiring and when a via hole or a contact hole is formed in the interlayer insulating film. Another object of the present invention is to provide a method of fabricating the semiconductor device. Yet another object of the invention is to provide a semiconductor device capable of reducing leakage current between wirings sandwiching an interlayer insulating film and a method of fabricating the same. Still another object of the invention is to provide a semiconductor device capable of preventing the diffusion of ingredients contained in the wiring to an interlayer insulating film, and a manufacturing method thereof.

According to a method of fabricating a semiconductor device of the present invention having an interlayer insulating film formed on a wiring, a silicon compound containing only silicon (Si), oxygen (O), carbon (C) and hydrogen (H) is converted into a plasma gas to react itself, thus forms a block insulating film containing Si, O, C and H between the wiring and the interlayer insulating film.

Since the silicon compound containing silicon (Si), oxygen (O), carbon (C) and hydrogen (H) is used and oxidizing agent is not used, a lower wiring, a copper wiring for example, can be prevented from being oxidized when the block insulating film is formed. Moreover, since the lower wiring has been already coated with the block insulating film when the interlayer insulating film is formed, the lower wiring can be prevented from being oxidized even if oxidizing agent is used in forming the interlayer insulating film.

Incidentally, the interlayer insulating film having a low dielectric constant is generally porous, and moisture tends to permeate the lower wiring from the outside through the interlayer insulating film. On the contrary to this, in the case where the block insulating film is formed between the lower wiring and the interlayer insulating film having a low dielectric constant, even if the moisture permeates from the outside through the interlayer insulating film, the block insulating film prevents the moisture from reaching the lower wiring. Thus, corrosion of the lower wiring can be prevented.

Moreover, by sandwiching the block insulating film between the lower wiring and the interlayer insulating film, a ingredient of the lower wiring, such as copper, is prevented from diffusing into the interlayer insulating film from the lower wiring. Thus, leakage current between the wirings sandwiching the interlayer insulating film can be reduced. In addition, a dielectric constant of the whole interlayer insulating film can be reduced since the block insulating film occupies only a fraction of the entire interlayer insulating film.

Furthermore, in the case where an opening portion reaching the lower wiring is formed in the interlayer insulating film, the interlayer insulating film formed on the lower wiring is first etched by using a photoresist film as a mask. At this time, etching is stopped so as not to etch the block insulating film. Subsequently, the block insulating film is etched after the photoresist film used as a mask is removed. With such etching, since the lower wiring is not exposed to an ashing gas and an etching gas for removing the photoresist film, ion bombardment to the lower wiring can be minimized to suppress etching of the lower wiring and oxidation thereof.

The block insulating film may underlaid with a sub block insulating film which is formed of a thin insulating film with a high relative dielectric constant and a high density. This sub block insulating film is formed of either a thin insulating film containing C and H or a thin insulating film containing Si and C. In this specification, the block insulating film formed on the sub block insulating film is referred to as a main block insulating film. Specifically, the block insulating film is a two-layered structure composed of the main block insulating film and the sub block insulating film. With such two-layered structure of the block insulating film, even if the sub block insulating with a high density is used, a dielectric constant of the whole interlayer insulating film can be reduced together with reducing leakage current.

A film with a high density can be formed in the following manner. For example, a plasma film-forming apparatus of a parallel plate type is used, and a power source of a low frequency and a power source of a high frequency are connected respectively to a lower and upper electrodes of the apparatus, and the supplied power of the low frequency is not higher than the supplied power of the high frequency.

Furthermore in the case of forming a block insulating film having a low dielectric constant, it is advantageous to use a compound having a siloxane bond (Si—O—Si) as the silicon compound. This is because silicon (Si) contained in the silicon compound already bonded with oxygen (O) in the form of a siloxane bond, which makes the leakage of current smaller.

Furthermore, in the case of using the compound having the siloxane bond as described above, it is advantageous to set a spacing between the lower and upper electrodes equal to 25 mm or lower. Narrowing the spacing increases a sheath region generated between the electrodes. As a result, the decomposition of the compound having a siloxane bond is facilitated, and a methyl group or the like contained in the film is reduced, thus making the film dense.

Similarly, when a power of $2/\pi(W/cm^2)$ or higher is applied to the substrate, decomposition of the compound having a siloxane bond is facilitated, which in turn forms a dense film.

DESCRIPTION OF THE DRAWING

FIGS. 1A to 1F are cross sectional views showing a semiconductor device and a method of fabricating the same according to a first embodiment of the present invention.

DESCRIPTION OF THE PREFERRED EMBODIMENT

Descriptions will be made for preferred embodiments with reference to the accompanying drawings below.

First Embodiment

Figure 13:
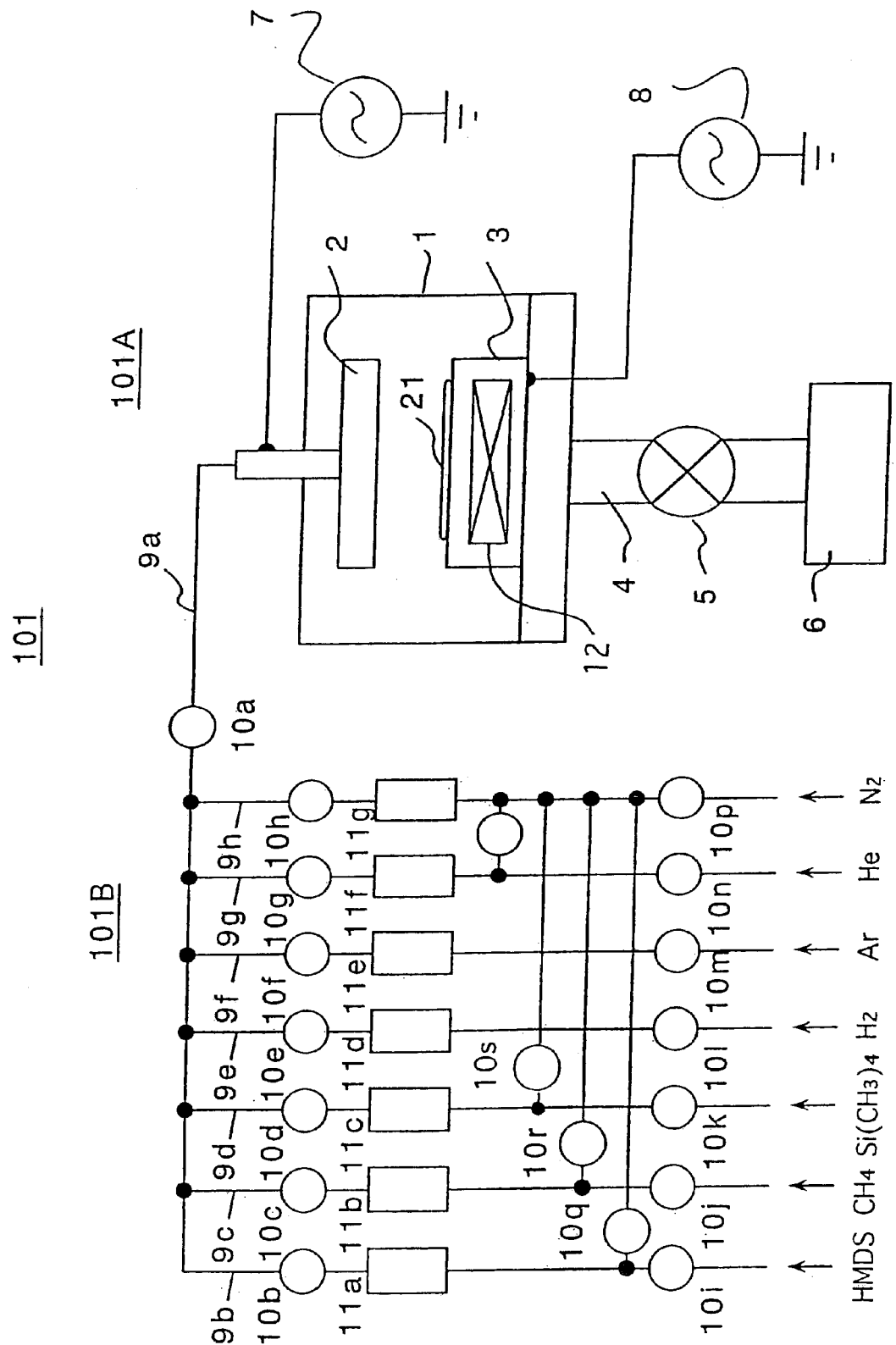
FIG. 13 is a side view showing a configuration of a plasma film-forming apparatus used for the embodiments of the present invention.

FIG. 13 is a side view showing a configuration of a plasma film-forming apparatus 101 of a parallel plate type used in the embodiments of the present invention.

This plasma film-forming apparatus 101 comprises a film-forming portion 101A and a gas supply portion 101B. The film-forming portion 101A serves as a section for forming a block insulating film on a substrate 21 with a plasma gas, while the gas supply portion 101B includes a plurality of gas sources for supplying film-forming gases.

Figure 6:
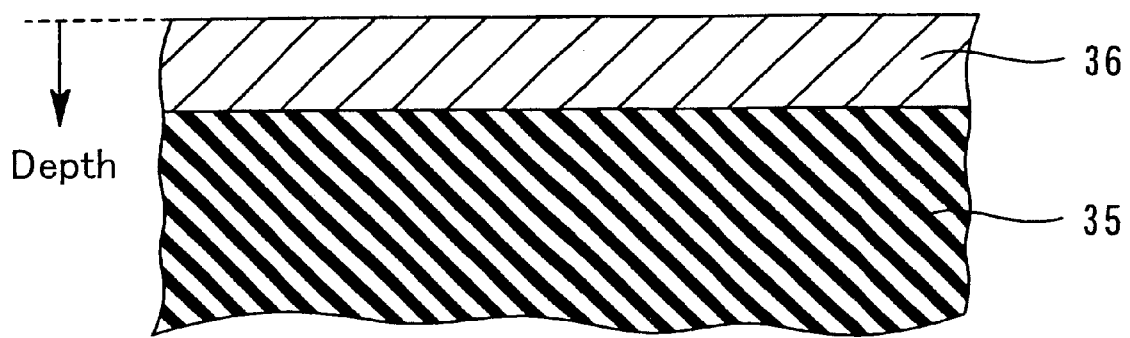
FIG. 6 is a sectional view showing a structure of a sample used for property investigation of a block insulating film according to a fourth embodiment of the present invention.

As shown in FIG. 6, the film-forming portion 101A includes a chamber 1 capable of reducing its internal pressure, which is communicated with an exhaust device 6 through an exhaust pipe 4. On the way of the exhaust pipe 4, an opening/closing valve 5 is provided for controlling gas continuity/discontinuity between the chamber 1 and the exhaust device 6. Provided on the chamber 1 is pressure measuring means (not shown) such as a vacuum gauge for monitoring a pressure within the chamber 1.

The chamber 1 includes a pair of electrodes opposite to each other therein, that is, an upper electrode (first electrode) 2 and a lower electrode (second electrode) 3. An RF power source 7 for supplying a high frequency power of 13.56 MHz is connected to the upper electrode 2, and an AC power source 8 for supplying alternate current power having a frequency of 380 kHz is connected to the lower electrode 3. These power sources 7 and 8 supply power to the upper and lower electrodes 2 and 3, respectively. Thus, the film-forming gas is converted into a plasma gas. The upper and lower electrodes 2 and 3 and the power sources 7 and 8 constitute plasma generating means for converting the film-forming gas into a plasma gas.

The upper electrode 2 serves also as a dispersing tool for dispersing the film-forming gas. A plurality of through holes (not shown) are formed in the upper electrode 2, and opening portions of the through holes on the opposite side to the lower electrode 3 serve as exhaustion ports (introduction ports) for the film-forming gas. These exhaustion ports for the film-forming gas or the like are communicated with the film-forming gas supplying portion 101B through a pipe 9a.

The lower electrode 3 serves also as a holding stage for holding the substrate 21. Moreover, the lower electrode 3 is provided with a heater 12 for heating the substrate 21 on the holding stage.

In the film-forming gas supply portion 101B, gas sources for supplying hexamethyldisiloxane (HMDS: $(CH_3)_3Si—O—Si(CH_3)_3$), methane ($CH_4$), tetramethylsilane ($Si(CH_3)_4$), hydrogen ($H_2$), argon (Ar), helium (He) and nitrogen ($N_2$) are provided. These gases are suitably supplied to the chamber 1 through branch pipes 9b to 9h and the pipe 9a communicated with all of the branch pipes 9b to 9h. On the way of the branch pipes 9b to 9h, flow-rate adjusting means 11a to 11g for adjusting a flow rate of gases and opening/closing means 10b to 10p for controlling gas continuity/discontinuity are disposed. On the way of the pipe 9a, opening/closing means 10a for opening/closing the pipe 9a is disposed. Note that among the above-described gases, $N_2$ is a gas for purging residual gases within the pipe 9a, the branch pipes 9b to 9d and the chamber 1.

The above-described film-forming apparatus 101 comprises a silicon-containing gas source (HMDS) and a CH-containing gas source. The apparatus 101 further comprises plasma generating means 2, 3, 7 and 8 for converting the film-forming gas into a plasma gas.

Thus, by means of the plasma enhanced CVD method, a block insulating film containing Si, O, C and H, a block insulating film containing Si, C and H, and a block insulating film containing C and H can be formed. Thus, as described in the embodiments of the invention below, an interlayer insulating film including a block insulating film having a low dielectric constant and showing high moisture resistance can be formed.

Furthermore, as plasma generating means, for example, there are plasma generating means using the first and second electrodes 2 and 3 of the parallel plate type, plasma generating means using an Electron Cyclotron Resonance (ECR) method and helicon plasma generating means using radiation of high frequency power from an antenna.

In this embodiment, among these plasma generating means, the plasma generating means is employed, in which the power sources 7 and 8 for supplying two kinds of power having a high frequency and a low frequency respectively, are connected to the first and second electrodes 2 and 3 of the parallel plate type. Plasma can be generated by supplying the power having a high frequency and the power having a low frequency to the electrodes 2 and 3 respectively. Thus, a formed insulating film has a high density. Furthermore, since the formed film contains $CH_3$, it exhibits a low dielectric constant.

The film-forming gases for forming a block insulating film to which the present invention can be applied are shown as follows.

(i) Film-forming gas containing Alkyl-group Monomethylsilane ($SiH_3(CH_3)$)
  Dimethylsilane ($SiH_2(CH_3)_2$)
  Trimethylsilane ($SiH(CH_3)_3$)
  Tetrametylsilane ($Si(CH_3)_4$)
(ii) Film-forming gas containing Alkoxyl-group
  Hexamethyldisiloxane(HMDS: $(CH_3)_3Si\text{—}O\text{—}Si(CH_3)_3$) Octamethylcyclotetrasiloxane(OMCTS: [Formula 1]

[Formula 1]

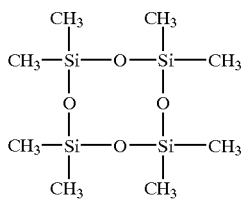

Methylmethoxysilane ($SiH_2(OCH_3)(CH_3)$)
  Dimethylmethoxysilane ($SiH(OCH_3)(CH_3)_2$)
  Trimethhoxysilane ($SiH(OCH_3)_3$)
  Tetramethoxysilane ($Si(OCH_3)_4$)
  Tetraethoxysilane (TEOS: $Si(OC_2H_5)_4$)
(iii) Film-forming gas composed of $C_xH_y$
  Methane ($CH_4$)
  Ethylene ($C_2H_4$)
  Ethane ($C_2H_6$)

(iv) Film-forming gas composed of $Si_xH_y$
  Silane ($SiH_4$)
  Disilane ($Si_2H_6$)

Next, descriptions will be made for a semiconductor device and a method of fabricating the same according to the first embodiment of the present invention with reference to FIG. 1.

FIGS. 1A to 1F are cross sectional views showing the semiconductor device and the method of fabricating the same according to the first embodiment of the present invention.

Figure 1A:
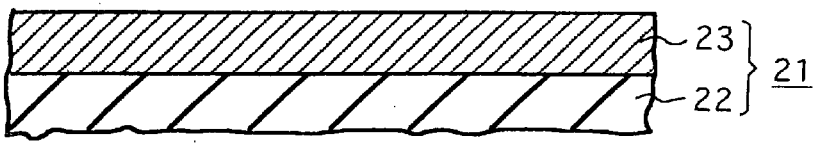

FIG. 1A is a cross sectional view showing a state after a copper wiring is formed. In the drawing, reference numeral 22 denotes a base insulating film, and reference numeral 23 denotes a copper wiring (lower wiring). These constitute the substrate 21.

Figure 1B:
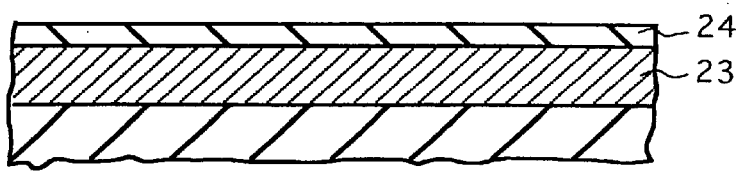

Under such circumstances, as shown in FIG. 1B, the block insulating film 24 is formed on the copper wiring 23 by means of the plasma enhanced CVD method. First, hexamethyldisiloxane (HMDS) is introduced into the chamber 1 of the plasma film-forming apparatus shown in FIG. 6 at a flow rate of 80 sccm, and a pressure therein is held at 1 Torr. Subsequently, the upper electrode 2 is supplied with power of 50 W having a frequency of 13.56 MHz, and the lower electrode 3 is supplied with power of 200 W having a frequency of 380 kHz. Thus, hexamethyldisiloxane is converted into a plasma gas. By keeping the above-described state for a predetermined time, the block insulating film 24 composed of an insulating film containing Si, O, C and H, which has a thickness of 50 nm, is formed. According to the investigation, regarding the formed insulating film containing Si, O, C and H, the relative dielectric constant was 3.1, and the leakage current was 10–10 $A/cm^2$ under an electric field strength of 1 MV/cm. Moreover, according to the Electron Spectroscopy for Chemical Analysis (ESCA), the composition of the block insulating film 24 was Si:O:C= 1:1:1. Note that the block insulating film 24 contains H though quantitative determination thereof could not be made.

Figure 1C:
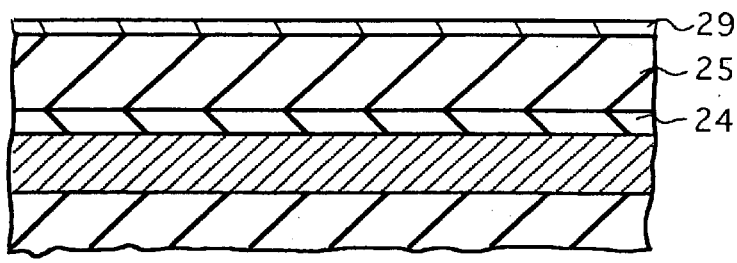

Next, as shown in FIG. 1C, by means of the well-known plasma enhanced CVD method, an interlayer insulating film 25 composed of a porous silicon-containing insulating film having a low dielectric constant, which has a film thickness of 500 nm, is formed. As a method of forming the porous silicon-containing insulating film, for example, there exists a method of forming an interlayer insulating film composed of a multi-layered thin film by repeating a film-forming process using a low-pressure thermal CVD method and a film-forming process using a plasma enhanced CVD method. Moreover, there exists a method of forming an interlayer insulating film composed of a multi-layered thin film by stacking organic films and $SiO_2$ films alternately and then performing ashing with an oxygen plasma gas to remove an organic matter.

Subsequently, an NSG film (silicon oxidation film containing no impurities) which is thin and has a high density or an insulating film containing SiOC is formed, either of which serves as a protective film 29 for the porous silicon-containing insulating film 25 in performing ashing and etching. In the case where the protective film 29 does not exist, the porous silicon-containing insulating film 25 may be degenerated due to treatment gas in ashing a photoresist film 26 or in etching the block insulating film 24 under the porous silicon-containing insulating film 25, thus deteriorating the low dielectric constant property of the film 25. In some cases, the protective film 29 may be omitted.

Figure 1D:
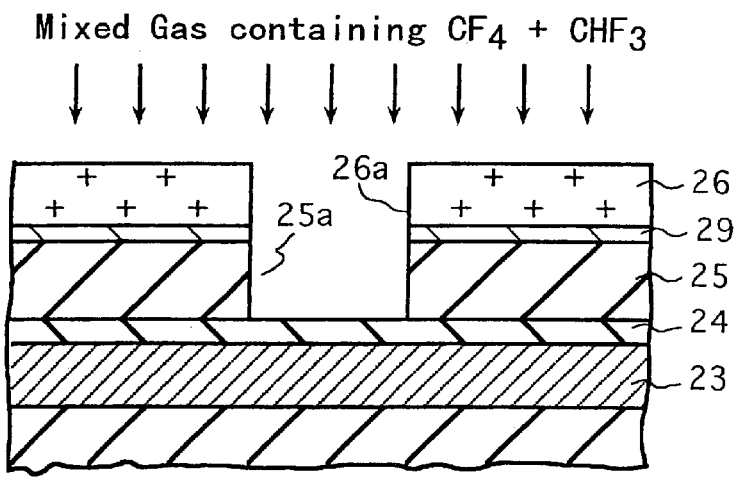

Next, as shown in FIG. 1D, after the photoresist film 26 is formed, patterning of the photoresist film 26 is performed to form an opening portion 26a of the photoresist film 26 in a region where a via hole is to be formed. Subsequently, by reactive ion etching (RIE) using a plasma gas obtained by converting a mixed gas containing $CF_4+CHF_3$ to plasma, the interlayer insulating film 25 is etched through the opening portion 26a of the photoresist film 26, thus removing the interlayer insulting film 25. Thus, an opening portion 25a is formed to expose the block insulating film 24. Thereafter, the photoresist film 26 is ashed. At this time, the block insulating film 24 has an etching proof property against the etching gas and the ashing gas for treating the above-described interlayer insulating film 25. Accordingly, the copper wiring 23 is not adversely affected by the etching gas and the like. Concentration of the mixed gas containing $CF_4+CHF_3$ may be adjusted by adding $Ar+O_2$. Next, as shown in FIG. 1E, by the reactive ion etching (RIE), the block insulating film 24 is etched through an opening portion of the protective film 29 and the opening portion 25a of the interlayer insulating film 25, thus removing the block insulating film 24. As the etching gas, a mixed gas containing $CF_4+CHF_3$ having a different composition ratio from the gas used for etching the interlayer insulating film 25 is used. Thus, a via hole 27 is formed to expose the copper wiring 23 on the bottom portion thereof. At this time, the copper wiring 23 has an etching proof property against the etching gas for the above-described block insulating film 24. Accordingly, the copper wiring 23 is not adversely affected by the etching gas. Note that, although the surface of the copper wiring is oxidized, the surface is exposed to a plasma gas of hydrogen that is diluted with a reductive gas including, for example, $NH_3$, and an inert gas such as Argon and Nitrogen after completing the process of ashing the resist film and the process of etching the block film, and hence the oxidized substance is removed.

Subsequently, after the photoresist film 26 is removed, a base film (not shown) made up of a conductive film and a copper film is laid in the via hole 27. The copper film is formed by the sputtering method. And an example of the conductive film is a barrier metal film composed of tantalum nitride (TaN) or the like.

Subsequently, as shown in FIG. 1F, a copper film is formed on the base film so as to fill the via hole 27. After this step, an upper wiring 28 composed of copper or aluminum is formed so as to connect through the via hole 27 to the lower wiring 23.

Thus, formation of the upper wiring 28 is completed, which is connected to the lower wiring 23 through the via hole 27 opened through both of the interlayer insulating film 25 and the block insulating film 24.

As described above, according to this embodiment of the present invention, the block insulating film 24 containing silicon (Si), oxygen (O), carbon (C) and hydrogen (H) is formed between the lower wiring 23 and the interlayer insulating film 25 by converting the silicon compound containing only silicon Si, O, C and H into a plasma gas to react itself.

Since the silicon compound containing only silicon (Si), oxygen (O), carbon (C) and hydrogen (H) is used and oxidizing agent is not used, the lower wiring 23 can be prevented from being oxidized when the block insulating film 24 is formed. Moreover, since the lower wiring 23 has been already coated with the block insulating film 24 when the interlayer insulating film 25 is to be formed, the lower wiring 23 can be prevented from being oxidized even if oxidizing agent is used for forming the interlayer insulating film 25.

Incidentally, the interlayer insulating film 25 having a low dielectric constant is generally porous, and moisture tends to permeate the lower wiring 23 from the outside through the interlayer insulating film 25. On the contrary to this, in the case where the block insulating film 24 is formed between the lower wiring 23 and the interlayer insulating film 25 having a low dielectric constant, even if moisture permeates from the outside through the interlayer insulating film 25, the block insulating film 24 prevents the moisture from reaching the lower wiring 23. Thus, corrosion of the lower wiring 23 can be prevented. Moreover, by sandwiching the block insulating film 24 between the interlayer insulating film 25 and the lower wiring 23, diffusion of the copper (ingredient of the wiring 23) is prevented. Thus, leakage current between the wirings 23 and 28 sandwiching the interlayer insulating film 25 can be reduced. In addition, a dielectric constant of the whole interlayer insulating film including the block insulating film 24 and interlayer insulating film 25 can be lowered since the block insulating film 24 occupies only a fraction of the whole interlayer insulating film.

Furthermore, in the case where the via hole 27 reaching the lower wiring 23 is formed in the interlayer insulating film 25 and the block insulating film 24, only the interlayer insulating film 25 formed on the block insulating film 24 is first etched, and etching is stopped so as not to etch the block insulating film 24 at this time. Subsequently, the block insulating film 24 is etched. With such etching, ion bombardment to the lower wiring 23 by the ashing gas or the like for removing a etching mask can be minimized, thus suppressing etching of the lower wiring 23.

By using the plasma film-forming apparatus of the parallel plate type, connecting the RF and AC power sources 7 and 8 of high and low frequencies to the lower and upper electrodes 2 and 3 respectively, and setting the supplied power of the low frequency higher than the supplied power of the high frequency, a film having a high density, used as the block insulating film 24, can be formed.

Note that, although HMDS is used as the silicon compound containing only silicon (Si), oxygen (O), carbon (C) and hydrogen (H) in the above description, other silicon compounds as the above-described compound can be used.

Moreover, a film-forming gas, in which at least one of an inert gas ($N_2$, Ar and He), a hydrogen gas and a $C_xH_y$ gas is added to the above-described silicon compound, may be used.

Second Embodiment

Figure 2A:
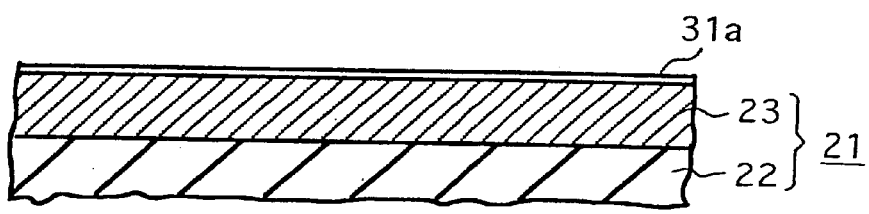
FIGS. 2A and 2B are cross sectional views showing a semiconductor device and a method of fabricating the same according to a second embodiment of the present invention.
Figure 2B:
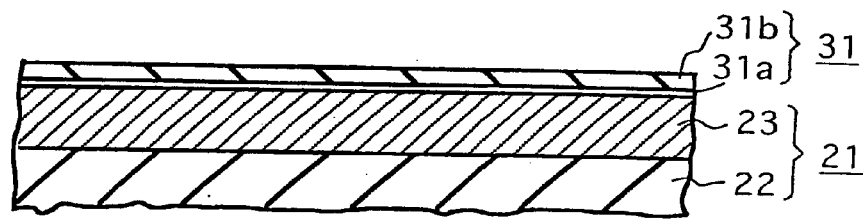

FIGS. 2A and 2B are cross sectional views showing a semiconductor device and a method of fabricating the same according to the second embodiment of the present invention.

What is different from the first embodiment shown in FIG. 1 is that the block insulating film 31 is separated into two layers of a sub block insulating film 31a and a main block insulating film 31b.

Descriptions will be made for a method of forming the block insulating film 31 having the two layers composed of the main block insulating film 31b and the sub block insulating film 31a. A reason for adopting such a layer structure is to completely prevent oxidation of the surface of the copper wiring 23 by using a film-forming gas for forming the sub block insulating film 31a contacting the copper wiring 23, which contains no oxygen. Another reason is for more completely preventing diffusion of the copper.

First, as shown in FIG. 2A, the copper wiring 23 is formed on the base insulating film 22. Subsequently, the block insulating film 31 composed of two layers is formed on the copper wiring 23 by the plasma enhanced CVD method.

Specifically, $CH_4$ is introduced into the chamber 1 of the plasma film-forming apparatus shown in FIG. 13 at a flow rate of 50 sccm, and held for five seconds. Thus, the copper wiring 23 is coated to form the sub block insulating film 31a composed of an insulating film containing C and H, which has a thickness of 10 nm. This is shown in FIG. 2B.

Next, hexamethyldisiloxane (HMDS) is introduced into the chamber 1 at a flow rate of 80 sccm in the same manner, and a pressure within the chamber 1 is held at 1 Torr. Subsequently, the upper electrode 2 is supplied with power of 50 W having a frequency of 13.56 MHz, and the lower electrode 3 is supplied with power of 200 W having a frequency of 380 kHz. Thus, hexamethyldisiloxane is converted into a plasma gas. By keeping the above-described state for a predetermined time, the main block insulating film 31b composed of an insulating film containing Si, O, C and H, which has a thickness of 50 nm, is formed. According to the investigation, regarding the formed two-layered block insulating film 31, the relative dielectric constant was 3.2, and the leakage current was in the level of 10–10 A/cm$^2$ under a field strength of 1 MV/cm. Moreover, the composition of the main block insulating film 31b was Si:O:C= 1:1:1, and contained a small amount of H as well.

As described above, according to the second embodiment of the invention, unlike in the first embodiment, the two-layered block insulating film 31 composed of the sub block insulating film 31a containing C and H and the main block insulating film 31b containing Si, O, C and H is formed. Especially, the main block insulating film 31b is underlaid with the thin insulating film containing C and H, which has a high density but a high dielectric constant and serves as the sub block insulating film 31a. By forming the block insulating film 31 so as to have two layers in the manner as described above, even if an insulating film having a high dielectric constant is used for the sub block insulating film 31a, the dielectric constant of the whole interlayer insulating film 25 including the block insulating film 31 can be lowered.

Moreover, since the film-forming gas for the sub block insulating film 31a contains only $CH_4$ and not oxygen, oxidation of the surface of the copper wiring 23, on which the film 31a are formed, can be completely prevented.

Furthermore, since the sub block insulating film 31a has high density, diffusion of the copper can be more completely prevented together with reducing leakage current flowing through the interlayer insulating film 25.

Though the film containing C and H is used for the sub block insulating film 31a in the above description, the present invention should not be limited to this specific embodiment. For example, the film containing Si and C may be used for the sub block insulating film 31a alternatively. In this case, as described in the first embodiment, the sub block insulating film 31a can be formed by converting monomethylsilane ($SiH_3(CH_3)$), dimethylsilane ($SiH_2(CH_3)_2$), trimethylsilane ($SiH(CH_3)_3$) and tetrametylsilane ($Si(CH_3)_4$) into a plasma gas to react itself. Still further, the sub block insulating film 31a can be formed by converting a mixed gas of $Si_xH_y$ and $C_xH_y$ into a plasma gas to react themselves.

In the same manner as described above, by using a gas containing no oxygen as a film-forming gas of the sub block insulating film contacting the copper wiring, oxidation of the surface of the copper wiring can be completely prevented, and diffusion of the copper can be more completely prevented.

Third Embodiment

Figure 3:
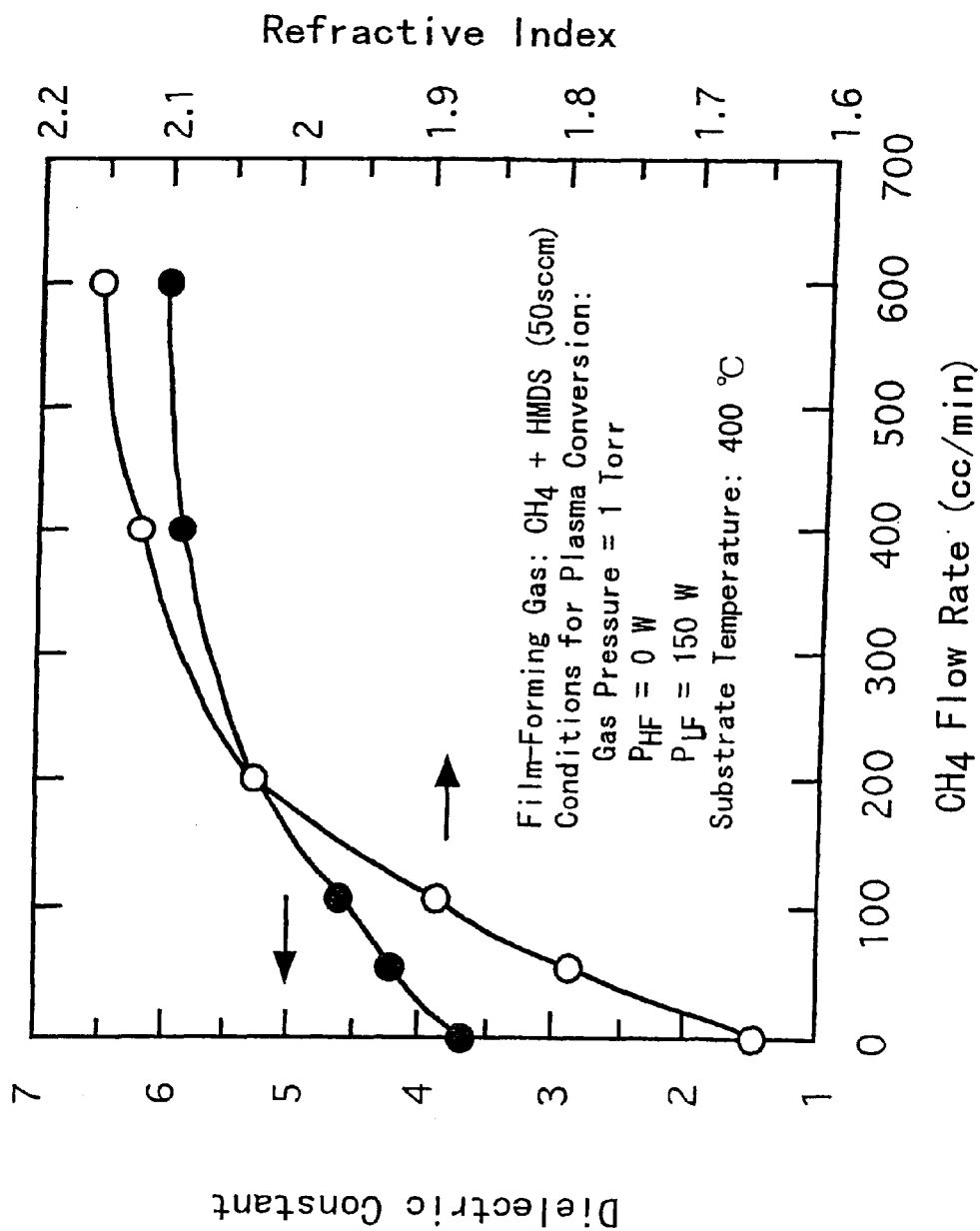
FIG. 3 is a graph showing properties of a dielectric constant and a refractive index of a block insulating film according to a third embodiment of the present invention.
Figure 4:
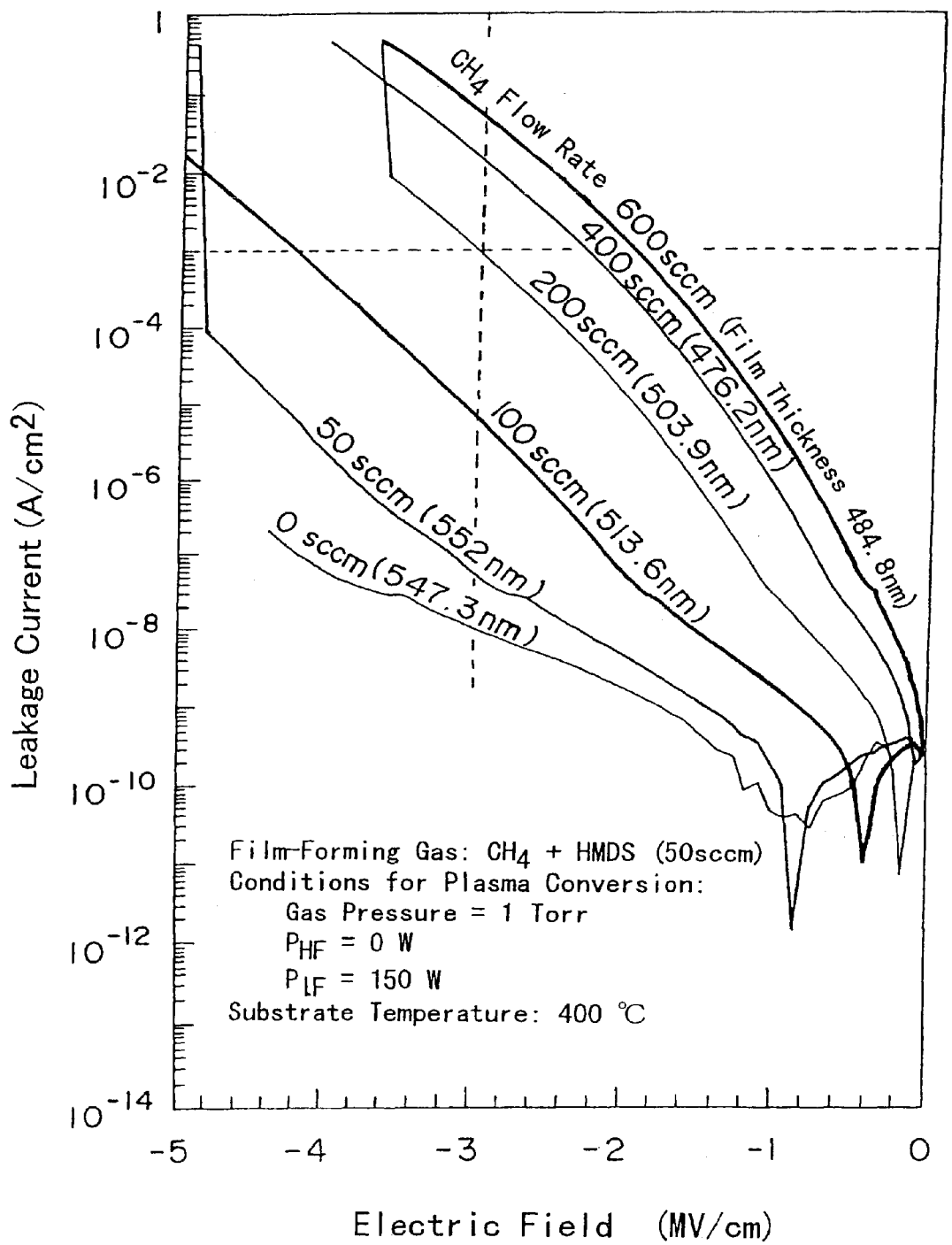
FIG. 4 is a graph showing a property of leakage current of the block insulating film according to the third embodiment of the present invention.
Figure 5:
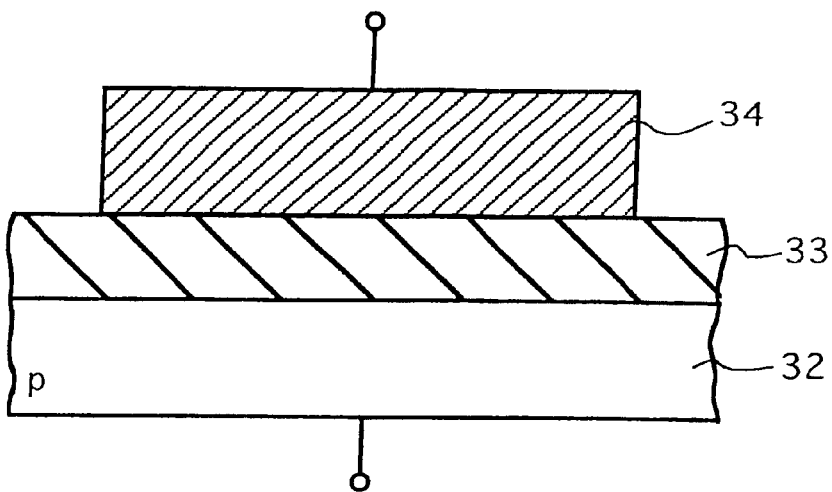
FIG. 5 is a cross sectional view showing a structure of a sample used for a property investigation for the block insulating film according to the third embodiment of the present invention.

FIGS. 3 and 4 are graphs showing results obtained by investigating properties of a block insulating film formed by a method of fabricating a semiconductor device according to the third embodiment of the present invention. FIG. 5 is a cross sectional view showing a structure of a sample used for the above-described investigation.

The sample used for the above-described investigation was prepared as below. Specifically, as shown in FIG. 5, a block insulating film 33 made of a SiOCH film (which is an aberration of the film containing Si, O, C and H) was formed on a p-type silicon substrate 32 by the plasma enhanced CVD method using a mixture of $CH_4$ and HMDS as a film-forming gas. Conditions for forming the block insulating film 33 are listed in TABLE 1 as follows.

TABLE 1

Block insulating film
Film-forming gas (flow rate):
$CH_4$ (0, 50, 100, 200, 400, 600 sccm) + HMDS (50 sccm)
Conditions for plasma conversion:
gas pressure = 1 Torr
high frequency power (13.56 MHz) P HF = 0 W
low frequency power (380 kHz) P LF = 150 W
Temperature of heating substrate: 400° C.

Furthermore, a mercury probe 34 having an electrode area of 0.0238 cm$^2$ was brought into contact with the surface of the block insulating film 33.

In the case of measuring a relative dielectric constant, a C-V measuring method, in which a high frequency signal of 1 MHz was superimposed on a DC bias, was used. In the case of measuring a refractive index, ellipsometer employing He—Ne laser whose wavelength is 633.8 nm was used. Moreover, in the case of measuring leakage current, the silicon substrate 32 was grounded, and a minus voltage was applied to the mercury probe 34.

Results of measuring a relative dielectric constant and a refractive index are shown in FIG. 3. An axis of ordinate of the left side of FIG. 3 shows relative dielectric constants represented in a linear scale, and an axis of ordinate of the right side shows refractive indexes represented in a linear scale. An axis of abscissa thereof shows flow rates (cc/min, sccm) of $CH_4$ represented in a linear scale. As shown in FIG. 3, the relative dielectric constant is approximately 3.6 when the flow rate of $CH_4$ is 0 sccm, and is approximately 6 when the flow rate of $CH_4$ is 600 sccm. The dielectric constant increases as the flow rate of $CH_4$ increases. Moreover, the refractive index has a similar tendency. When the flow rate of $CH_4$ is 0 sccm, the refractive index is approximately 1.65. When the flow rate of $CH_4$ is 600 sccm, the refractive index is approximately 2.15.

Furthermore, results of measuring leakage current are shown in FIG. 4. An axis of ordinate of FIG. 4 shows leakage current (A/cm$^2$) represented in a logarithm scale. An axis of abscissa thereof shows an electric field (MV/cm), which is applied to the block insulating film 33, represented in a linear scale. Note that a minus sign of the axis of abscissa represents that a minus potential is applied to the mercury probe 34.

As shown in FIG. 4, the leakage current decreases as the flow rate of $CH_4$ decreases. Practically, the leakage current should be $10^{-3}$ A/cm$^2$ or less under the electric field strength of 3 MV/cm.

Fourth Embodiment

The inventors conducted further investigation on the property of the foregoing block insulating film. The result of this investigation will be explained as follows.

① Diffusion of Copper into the Block Insulating Film

Since the block insulating film is formed between a copper wiring and an interlayer insulating film, it is preferable to have a function of preventing copper (Cu) contained in the copper wiring from diffusing into the interlayer insulating film. This is because the diffusion of copper (Cu) into the interlayer insulating film increases the leakage current in the interlayer insulating film and deprives the interlayer insulating film of the function as an insulating film.

Thus, as shown in FIG. 6, the inventors formed a block insulating film 36 on a copper wiring 35, and investigated a degree to which the copper contained in the underlying copper wiring 35 defuses into the block insulating film 36.

In this investigation, the condition for forming the block insulating film 36 is as follows (condition A).

(Condition A)
Film-forming gas (flow rate):
    $CH_4$(200 sccm)+HMDS (50 sccm)
Condition for conversion to plasma:
    gas pressure=1 Torr
    High frequency power (13.56 MHz)PHF=100 W
    Low frequency power (380 KHz)PLF=200 W
Substrate temperature: 375° C.
Deposited film thickness: 100 nm
Wafer size: 8 inch It should be noted that the high frequency power (13.56 MHz) is applied to the upper electrode 2 (see FIG. 13), while the low frequency power (380 KHz)PLF is applied to the lower electrode 3. Inert gas for pressure adjustment may be added to the film-forming gas. He, Ar, $N_2$ or the like may be used for the inert gas.

Figure 7:
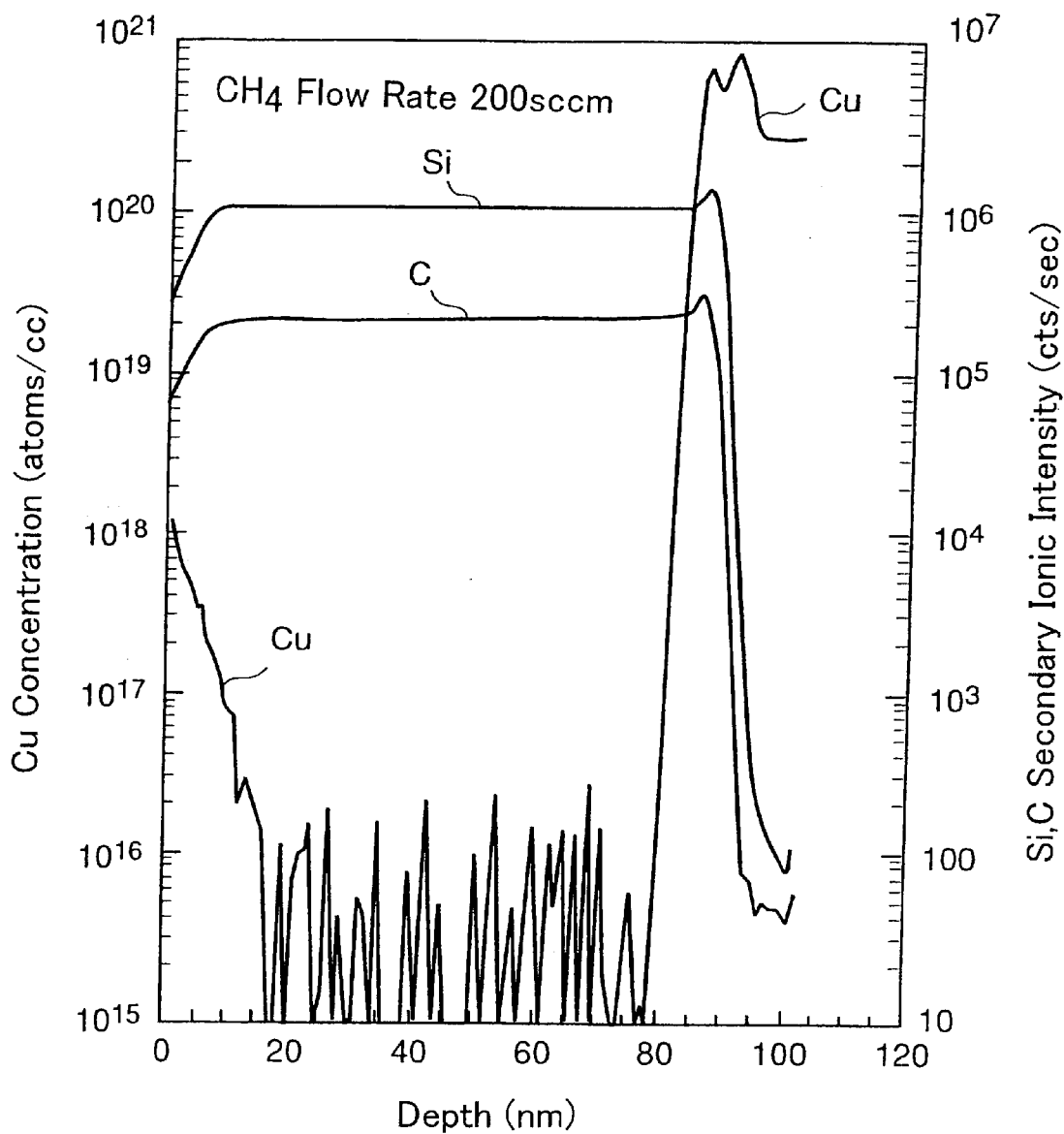
FIG. 7 is a graph showing a tendency of copper diffusion into a block insulating film according to a forth embodiment of the present invention, which is measured immediately after forming the block insulating film.

FIG. 7 illustrates a tendency of copper diffusion into the block insulating film 36, which was measured immediately after forming the block insulating film 36 under the (condition A). More specifically, FIG. 7 is a graph showing the result of measurement carried out by Secondary Ion Mass Spectrometry (SIMS). An abscissa represents a depth from the surface of the block insulating film 36 in linear scale, and an ordinate on the left side represents the concentration of copper (Cu) (atoms/cc) in the block insulating film 36 in logarithmic scale. In the drawing, just for reference, secondary ionic intensity of silicon (Si) and carbon (C) are shown. An ordinate on the right side of the drawing represents such a secondary ionic intensity by cts/sec. (count per second) in logarithmic scale.

As can be understood from FIG. 7, at the depth of 20 to 80 nm, it is observed that little copper (Cu) diffuses from the copper wiring 35 into the block insulating film 36.

Figure 8:
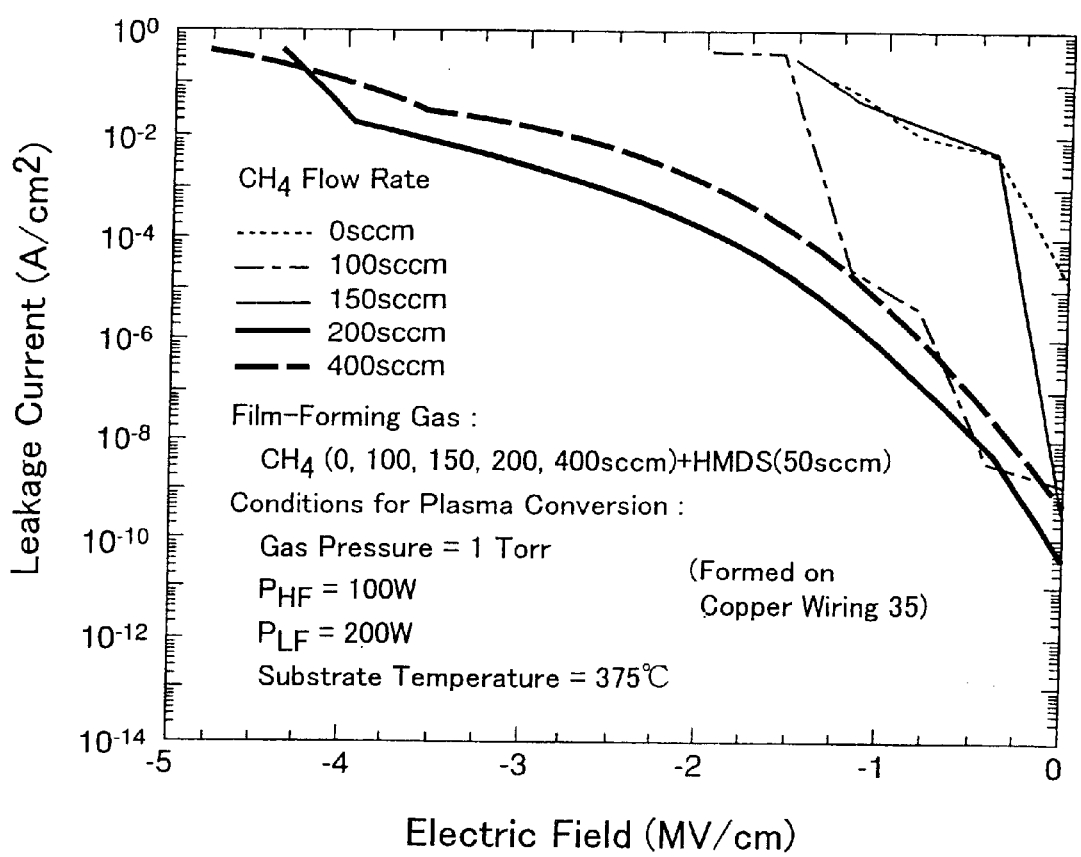
FIG. 8 is a graph showing a property of leakage current in the block insulating film according to the fourth embodiments of the present invention, which is measured immediately after forming the block insulating film.

FIG. 8 is a graph showing the property of leakage current in the block insulating film 36, which was measured immediately after forming the block insulating film 36. The measurement of this leakage current was carried out by bringing a mercury probe (not shown) having a electrode area of 0.02267 $cm^2$ into contact with the block insulating film 36 shown in FIG. 6, and applying a negative potential to the mercury probe together with grounding the copper wiring 35. In this measurement, the condition for forming the block insulating film 36 is as follows (condition B).

(Condition B)
Film-forming gas (flow rate):
    $CH_4$(0, 100, 150, 200, 400 sccm)+HMDS(50 sccm)
Condition for conversion to plasma:
    gas pressure=1 Torr
    High frequency power (13.56 MHz)PHF=100 W
    Low frequency power (380 KHz)PLF=200 W
Substrate temperature: 375° C.
Deposited film thickness: 100 nm
Wafer size: 8 inch It can be understood that under the (condition B), the flow rate of $CH_4$ is changed in various ways.

As can be understood from FIG. 8, even when the block insulating film 36 is formed on the copper wiring 35 as shown in FIG. 6, the leakage current in the block insulating film 36 is prevented from becoming excessively large.

Such good results were obtained immediately after the film formation. However, passed through a heating step, it is considered that copper (Cu) is diffused into the block insulating film 36.

Figure 9:
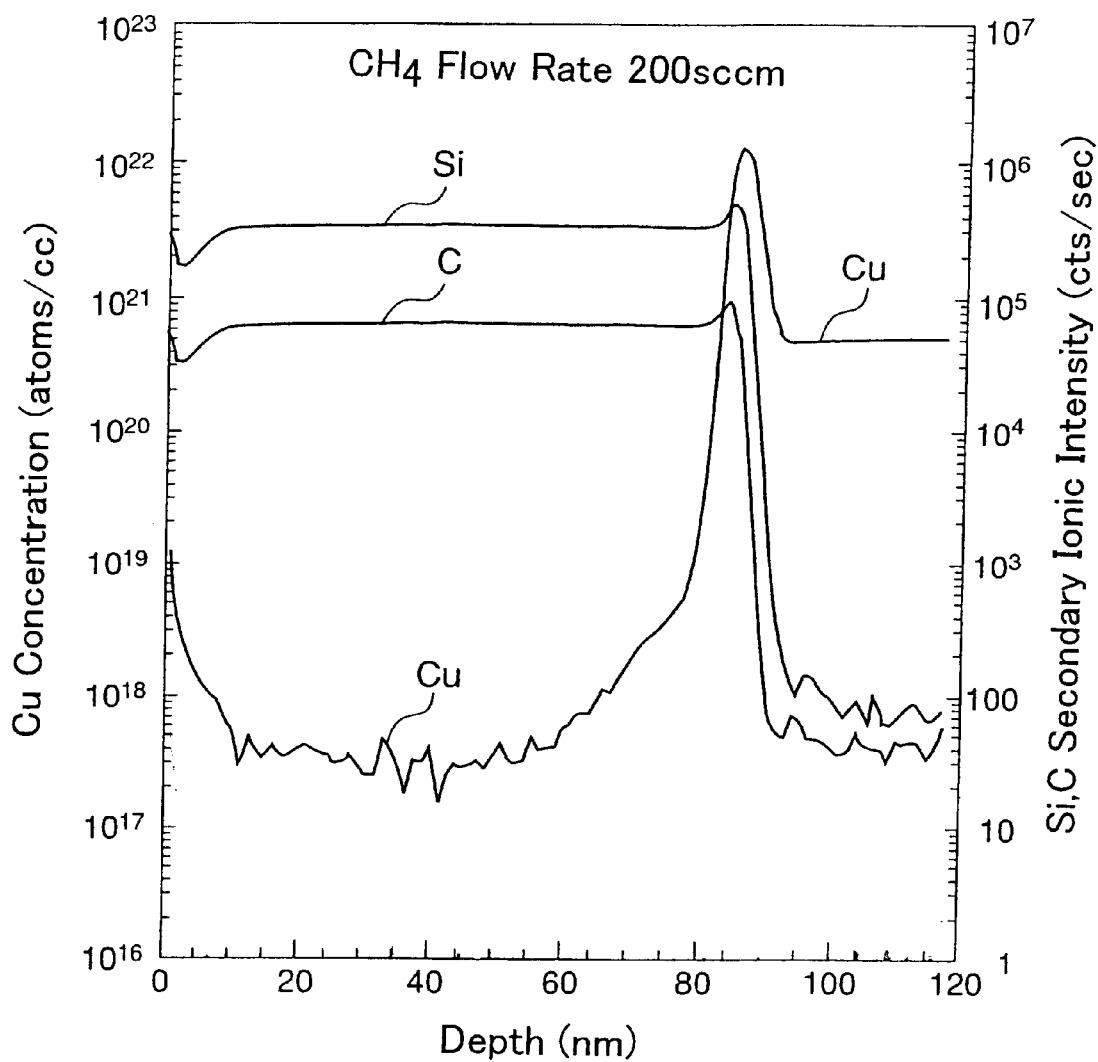
FIG. 9 is a graph showing a tendency of copper diffusion into a block insulating film according to a forth embodiment of the present invention, which is measured after annealing the block insulating film.

To verify this point, the inventors investigated the degree to which the copper (Cu) diffuses into the block insulating film 36 by subjecting the block film 36 formed under the foregoing (condition A) to 4-hour annealing in an atmospheric pressure $N_2$ at a temperature of 500° C. The result of this investigation is shown in FIG. 9. Similarly to FIG. 7, FIG. 9 is a graph showing the result of measurement carried out by Secondary Ion Mass Spectrometry (SIMS). In FIG. 9, just for reference, secondary ionic intensity of silicon (Si) and carbon (C) are also shown. An ordinate on the right side in FIG. 9 represents the secondary ionic intensity (cts/sec.) in logarithmic scale.

Compared with FIG. 7, FIG. 9 shows that copper (Cu) slightly diffuses in the film. For this copper (Cu), the inventors consider that it is not the one that defuses from the copper wiring 35 (see FIG. 6) into the block insulating film 36 by the annealing, but is detected by sputtering directly the wiring 35 with O (oxygen) ion employed in the SIMS.

Figure 10:
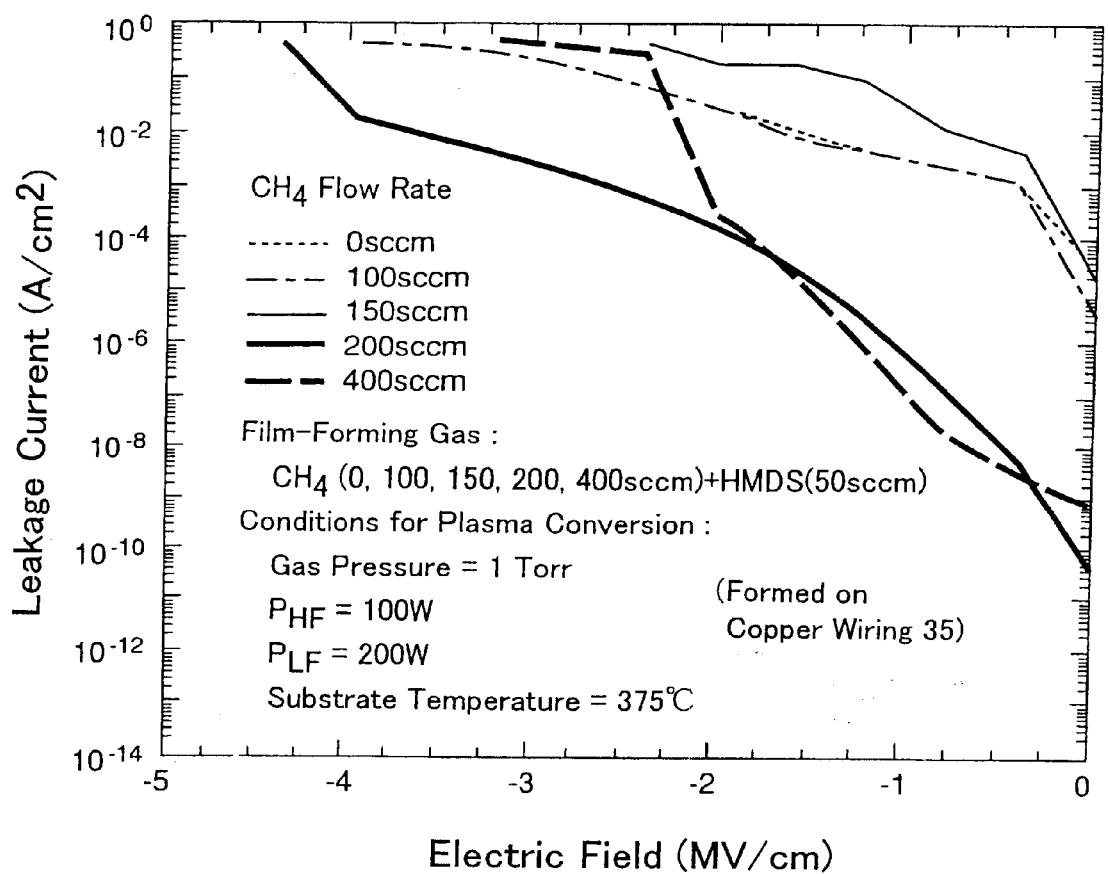
FIG. 10 is a graph showing a property of leakage cur rent in the block insulating film according to a forth embodiment of the present invention, which is measured after annealing the block insulating film.

FIG. 10 is a graph showing the property of leakage current in the block insulating film 36, which was formed under the forgoing (condition B) and subjected to the forgoing 4-hour annealing in the atmospheric pressure $N_2$ at the temperature of 500° C. As can be understood from FIG. 10, the leakage current in the block insulating film 36 shows a property substantially similar to that before annealing (see FIG. 8). This shows that even when the annealing is carried out, copper (Cu) does not diffuse into the block insulating film 36.

It should be noted that to prevent the diffusion of copper (Cu) into the block insulating film 36, the block insulating film 36 must be formed dense with no pores therein. What deduced from this point and the foregoing result of measurement is that the block insulating film 36 formed under the above-described condition is a dense film. The inventors further discovered the following points as conditions for forming the dense block insulating film 36.

(X) Narrowing a spacing between the upper and lower electrodes 2 and 3 (see FIG. 13)

(Y) Increasing a power applied to either the upper electrode 2 or the lower electrode 3.

Under the condition satisfying either or both of the (X) and (Y), in space between the upper and lower electrodes, a ratio of a region (sheath region) having potential gradient to an entire region increases. This facilitate the decomposition of HMDS and $CH_4$ in the film-forming gas, which in turn make it difficult for a methyl group such as $CH_4$ or the like to be contained in the formed film. This means that the formed film is a dense film having a few pores.

Among some conditions satisfying (X) and (Y), the inventors discovered the following particularly preferable conditions.

(X') setting the spacing between the upper and lower electrodes 2 and 3 (see FIG. 13) equal to 25 mm or lower.

(Y') setting either the power applied to the upper electrode 2 or the power applied to the lower electrode 3 equal to 200

W or higher when the wafer size is 8 inch (area of 100 πcm$^2$). This means that power of $2/\pi(\text{W/cm}^2)(=200 \text{ W}/(100 \pi\text{cm}^2))$ or higher is applied to the wafer per unit area.

② Dielectric Constant of the Block Insulating Film

In addition to be a highly dense film, the block insulating film should preferably have a low dielectric constant in order to reduce the RC delay of wiring. Thus, the inventors investigated the degree to which the relative dielectric constant of the block insulating attains, when the film was formed by increasing the power applied to the electrodes (upper and lower electrodes 2 and 3) as the above condition (Y). The condition for forming the block insulating film used for this investigation is as follows (condition c).

(Condition C)
Film-forming gas (flow rate):
  CH$_4$(200 sccm)+HMDS(50 sccm)
Condition for conversion to plasma:
  gas pressure=1 Torr
  High frequency power (13.56 MHz)PHF=100 W
  Low frequency power (380 KHz)PLF=100 W, 150 W, 200 W, 300 W
Substrate temperature: 375° C.
Deposited film thickness: 500 nm
Wafer size: 8 inch Note that, the high frequency power (13.56 MHz) is applied to the upper electrode 2 (see FIG. 13), while the low frequency power (380 KHz) is applied to the lower electrode 3.

As can be understood from the (condition C), in this investigation, the low frequency power (380 KHz) was varied. The result of the investigation is shown in FIG. 11.

Figure 11:
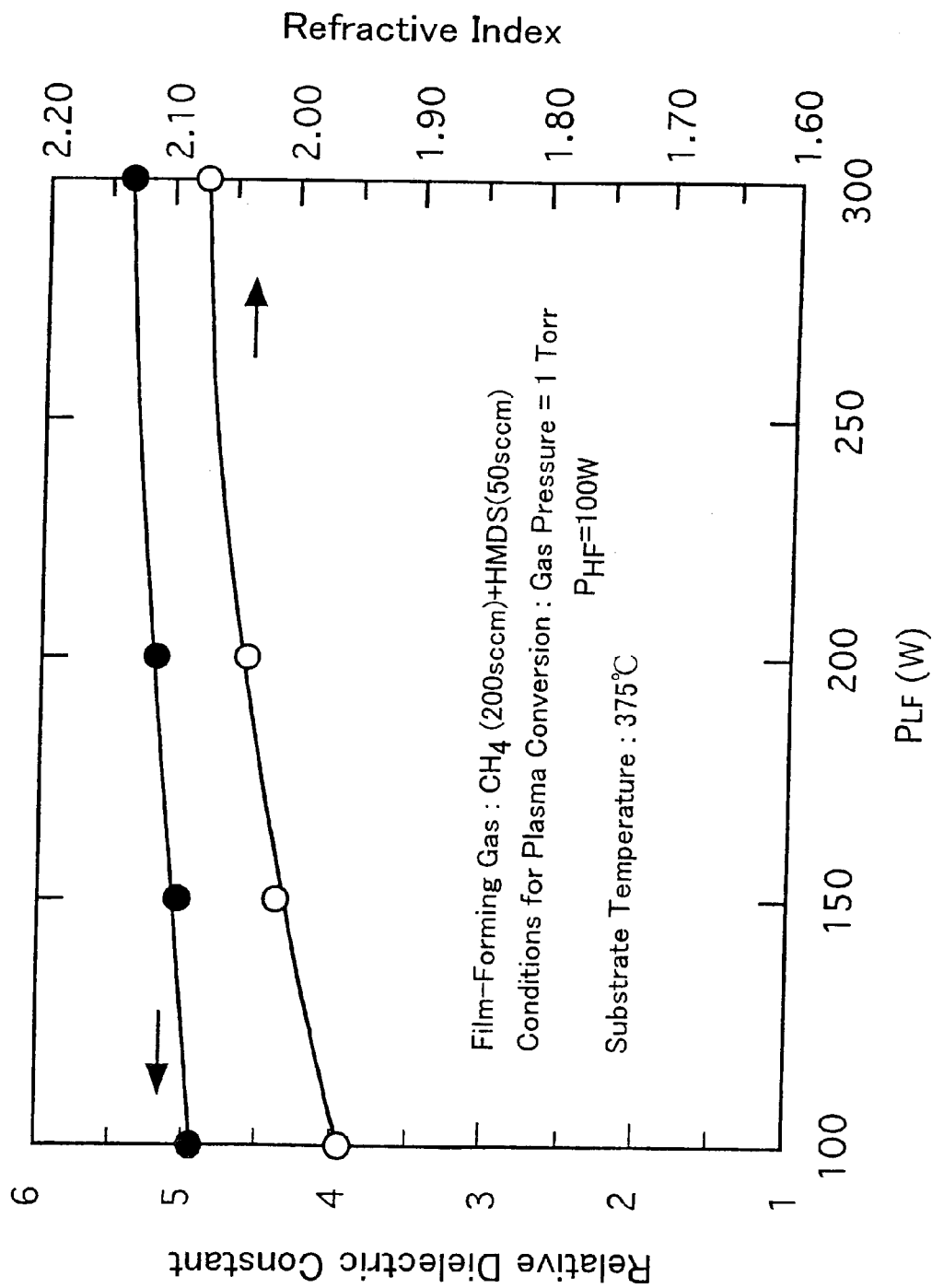
FIG. 11 is a graph showing properties of a relative dielectric constant and a refractive index of the block insulating film according to a fourth embodiment of the present invention.

As shown in FIG. 11, it is observed that even when the low frequency power (380 KHz) is increased, the dielectric constant of the film scarcely changes. This means that in spite of formed to be dense, the dielectric constant of the film is not raised. This is because silicon (Si) in HMDS is already bonded with oxygen (O) in the form of a siloxane bond (Si—O—Si), which makes the leakage current smaller. Accordingly, although HMDS was used in the embodiment, it is considered that a result similar to that in the foregoing case is obtained by using a compound having a siloxane bond. For such a compound, in addition to OMCTS as described in the first embodiment, Tetra Methyl Cyclo Tetra Siloxane (TMCTS) may be used. This TMCTS has the following chemical formula [Formula 2].

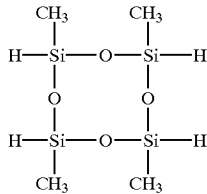

[Formula 2]

③ Leakage current of the block insulating film Being verified in the ② that the dielectric constant of the film scarcely changed even when low frequency power (380 KHz)PLF was increased, it is expected that the leakage current of the film also scarcely changed. To verify this point, the inventors investigated the leakage current of the block insulating film formed under the foregoing (condition C). The result of this investigation is shown in FIG. 12.

Figure 12:
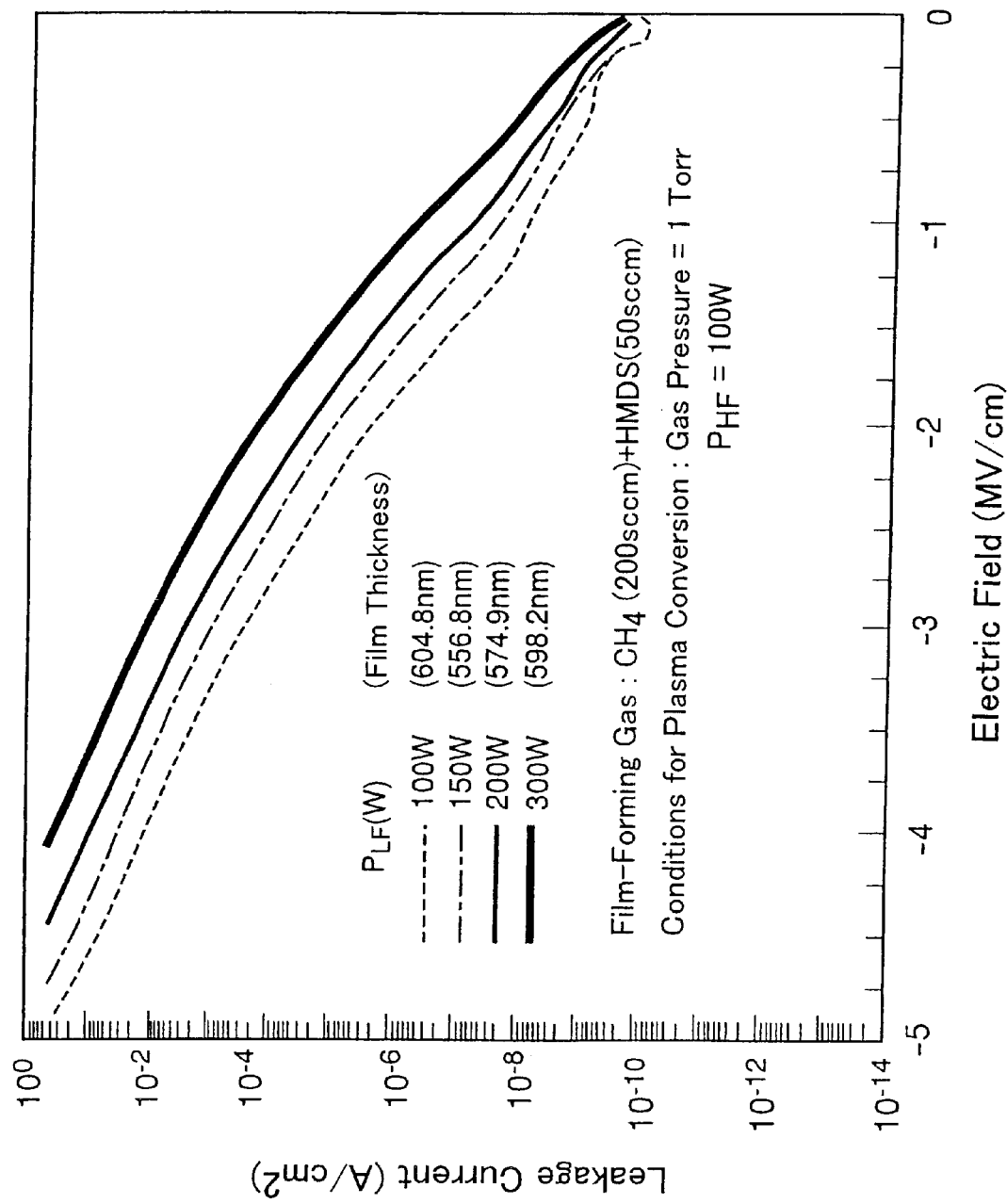
FIG. 12 is a graph showing a property of leakage current in the block insulating film according to a fourth embodiment of the present invention.

As shown in FIG. 12, when the low frequency power (380 KHz)PLF is increased, the current leakage of the film is slightly increased. But such an increase is not so noticeable.

As above, descriptions have been made for this invention in detail with reference to the embodiments. However, the scope of this invention is not limited to examples concretely shown in the above-described embodiments, modifications of the above-described embodiments without departing from the gist of this invention are involved in the scope of this invention.

As described above, according to the present invention, in the method of fabricating a semiconductor device in which an interlayer insulating film is formed on a substrate at the surface of which a wiring is exposed, a silicon compound containing silicon (Si), oxygen (O), carbon (C) and hydrogen (H) is converted into a plasma gas to react itself, thus forming a block insulating film containing Si, O, C and H between a wiring and an interlayer insulating film.

Since the silicon compound containing silicon (Si), oxygen (O), carbon (C) and hydrogen (H) is used as a film-forming gas and oxidizing agent is not used, the lower wiring can be prevented from being oxidized when the block insulating film is formed. Moreover, since the lower wiring has been already coated with the block insulating film when the interlayer insulating film is to be formed, the lower wiring can be prevented from being oxidized even if oxidizing agent is used for forming the interlayer insulating film.

Moreover, even if a porous interlayer insulating film with a low dielectric constant is used, since the block insulating film is formed between the lower wiring and the interlayer insulating film with a low dielectric constant, moisture can be prevented from permeating from the outside. Thus, corrosion of the lower wiring can be prevented. Moreover, by sandwiching the block insulating film between the interlayer insulating film and the lower wiring, diffusion of the copper is prevented. Thus, leakage current between the wirings sandwiching the interlayer insulating film can be reduced, and a dielectric constant of the whole interlayer insulating film can be lowered.

Furthermore, in the case where an opening portion reaching the lower wiring is formed in the interlayer insulating film, only the interlayer insulating film formed on the block insulating film is first etched, and etching is stopped so as not to etch the block insulating film. Subsequently, the block insulating film is etched. With such etching, ion bombardment to the lower wiring can be minimized, thus suppressing etching for the lower wiring.

Especially, under the block insulating, the sub block insulating film made of a thin insulating film is formed, which has a high density but a high relative dielectric constant, thus making the block insulating film in the form of the two-layered structure. According to this structure, even if the sub block insulating film with a high dielectric constant is used, the dielectric constant of the whole interlayer insulating film can be lowered. Furthermore, since the sub block insulating film has high density, diffusion of copper, the ingredient of the wiring, can be prevented together with reducing the leakage current of the interlayer insulating film.

Further, when one having a siloxane bond is used as the foregoing silicon compound, a block film having a low dielectric constant can be formed.

In such a case, it is possible to form a dense block film having a low dielectric constant by setting a spacing between the upper and lower electrodes of a parallel plate plasma film-forming apparatus equal to 25 mm or lower.

In this case, when power of $2/\pi(\text{W/cm}^2)$ or higher is applied to the substrate, it is possible to form a dense film since the decomposition of HMDS is facilitated.

What is claimed is:

1. A method of fabricating a semiconductor device, in which an interlayer insulating film is formed on a substrate at a surface of which a wiring is exposed, comprising the step of:

forming a block insulating film containing silicon, oxygen (O), carbon (C) and hydrogen (H) between said wiring and said interlayer insulating film by converting a silicon compound gas, in the absence of an oxidizing agent, into a plasma gas, said silicon compound containing said Si, O, C and H, said plasma gas reacting to form the block insulating film.

2. The method of fabricating a semiconductor device according to claim 1, wherein said block insulating film is formed by using a first electrode holding said substrate and a second electrode opposite to the first electrode, and by supplying large power of a low frequency to said first electrode and supplying small power of a high frequency to said second electrode to convert said silicon compound gas into said plasma gas.

3. The method of fabricating a semiconductor device according to claim 1, wherein said silicon compound contains at least one of an alkyl group and an alkoxyl group.

4. The method of fabricating a semiconductor device according to claim 1, wherein said film-forming gas is added with at least one of an inert gas, a hydrogen gas and a $C_xH_y$ gas.

5. A method of fabricating a semiconductor device, in which an interlayer insulating film is formed on a substrate at a surface of which a wiring is exposed, comprising the steps of:

forming a sub block insulating film containing carbon (C) and hydrogen (H) from a first film-forming gas plasma devoid of an oxidizing agent, to coat the wiring; and forming a main block insulating film containing silicon (Si), oxygen (O), carbon (C) and hydrogen (H) between said sub block insulating film and said interlayer insulating film by converting a silicon compound gas into a second film-forming gas plasma devoid of an oxidizing agent, said silicon compound containing said Si, O, C and H, said plasma gas reacting to form the main block insulating film.

6. The method of fabricating a semiconductor device according to claim 5, wherein said first film-forming gas plasma is formed by converting $C_xH_y$ gas into a plasma.

7. The method of fabricating a semiconductor device according to claim 5, wherein at least any one of said sub block insulating film and said main block insulating film is formed by using a first electrode holding said substrate and a second electrode opposite to the first electrode, and by supplying large power of a low frequency to said first electrode and supplying small power of a high frequency to said second electrode to form at least one of said gas plasmas.

8. A method of fabricating a semiconductor device, in which an interlayer insulating film is formed on a substrate at a surface of which a wiring is exposed, comprising the steps of:

forming a sub block insulating film containing silicon (Si) and carbon (C) from a first film-forming gas plasma devoid of an oxidizing agent, to coat the wiring; and forming a main block insulating film containing silicon (Si), oxygen (O), carbon (C) and hydrogen (H) between said sub block insulating film and said interlayer insulating film by converting a silicon compound gas into a second film-forming plasma gas devoid of an oxidizing agent, said silicon compound containing said Si, O, C and H, said plasma gas reacting to form the main block insulating film.

9. The method of fabricating a semiconductor device according to claim 8, wherein at least any one of said main block insulating film and said sub block insulating film is formed by using a first electrode holding said substrate and a second electrode opposite to the first electrode, and by supplying large power of a low frequency to said first electrode and supplying small power of a high frequency to said second electrode to form at least one of said gas plasmas.

10. The method of fabricating a semiconductor device according to claim 8, wherein the sub block insulating film containing said Si and C is formed by converting at least one of monomethylsilane ($SiH_3(CH_3)$), dimethylsilane ($SiH_2(CH_3)_2$), trimethylsilane ($SiH(CH_3)_3$) and tetrametylsilane ($Si(CH_3)_4$) into said first film-forming gas plasma.

11. The method of fabricating a semiconductor device according to claim 8, wherein the sub block insulating film containing said Si and C is formed by converting a $Si_xH_y$ gas and a $C_xH_y$ gas into said first film-forming gas plasma.

12. The method for manufacturing a semiconductor device according to claim 1, wherein a compound having a siloxane bond is used for said silicon compound.

13. The method for manufacturing a semiconductor device according to claim 12, wherein $CH_4$ is added to said silicon compound gas.

14. The method for manufacturing a semiconductor device according to claim 12, wherein said conversion to plasma is carried out by using a first electrode and a second electrode where the first electrode and the second electrode opposing to each other and the first electrode holding the substrate, and applying AC power to one of the first and second electrodes, and a spacing between the first and second electrodes is set equal to 25 mm or lower.

15. The method for manufacturing a semiconductor device according to claim 12, wherein said conversion to plasma is carried out by using a first electrode and a second electrode where the first electrode and the second electrode opposing to each other and the first electrode holding the substrate, and applying AC power to one of the first and second electrodes so that the substrate is subjected to a power of $2/\pi(W/cm^2)$ or higher.

16. The method for manufacturing a semiconductor device according to claim 12, wherein said compound having the siloxane bond is one selected from the group consisting of $HMDS((CH_3)_3Si—O—Si(CH_3)_3)$, $OMCTS((Si(CH_3)_2)_4)$, and $TMCTS(SiH(CH_3))_4O_4)$.

17. The method for manufacturing a semiconductor device according to claim 12, wherein inert gas is added to said silicon compound gas.

18. The method for manufacturing a semiconductor device according to claim 1, wherein said interlayer insulating film is a porous silicon-containing insulating film.

19. The method for manufacturing a semiconductor device according to claim 1, wherein said wiring is copper (Cu) wiring.

20. A semiconductor device manufactured by a semiconductor device manufacturing method according to claim 1.

* * * * *